(12) United States Patent
Jeon et al.

(10) Patent No.: US 12,446,205 B2
(45) Date of Patent: Oct. 14, 2025

(54) SEMICONDUCTOR DEVICE INCLUDING CAPACITOR STRUCTURE AND METHOD FOR MANUFACTURING THE SAME

(71) Applicant: Samsung Electronics Co., Ltd., Suwon-si (KR)

(72) Inventors: Intak Jeon, Seoul (KR); Younglim Park, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 538 days.

(21) Appl. No.: 17/950,185

(22) Filed: Sep. 22, 2022

(65) Prior Publication Data

US 2023/0232606 A1     Jul. 20, 2023

(30) Foreign Application Priority Data

Jan. 4, 2022    (KR) ........................ 10-2022-0000859

(51) Int. Cl.
    *H10B 12/00*       (2023.01)
    *H10D 1/68*        (2025.01)

(52) U.S. Cl.
    CPC ......... *H10B 12/033* (2023.02); *H10B 12/315* (2023.02); *H10D 1/696* (2025.01)

(58) Field of Classification Search
    CPC .... H10B 12/033; H10B 12/315; H10D 1/696; H10D 1/716; H10D 1/68
    See application file for complete search history.

(56) References Cited

U.S. PATENT DOCUMENTS

| | | | |
|---|---|---|---|
| 6,987,295 B2 | 1/2006 | Sell et al. | |
| 7,422,943 B2 | 9/2008 | Lee et al. | |
| 9,997,591 B2 | 6/2018 | Lee et al. | |
| 2006/0014385 A1 | 1/2006 | Kim et al. | |
| 2008/0185624 A1 | 8/2008 | Kim et al. | |
| 2009/0026518 A1 | 1/2009 | Lee et al. | |
| 2016/0071850 A1 | 3/2016 | Sakamoto et al. | |
| 2018/0019300 A1 | 1/2018 | Lee et al. | |
| 2021/0066446 A1 | 3/2021 | Lee et al. | |
| 2021/0257373 A1 | 8/2021 | Kang | |

FOREIGN PATENT DOCUMENTS

| | | |
|---|---|---|
| KR | 1020060013278 A | 2/2006 |
| KR | 100652426 B1 | 12/2006 |
| KR | 1020100085391 A | 7/2010 |
| KR | 1020190061857 A | 6/2019 |
| KR | 1020200019553 A | 2/2020 |
| TW | 548837 B | 8/2003 |
| TW | 201904077 A | 1/2019 |
| TW | 202133349 A | 9/2021 |

*Primary Examiner* — Samuel A Gebremariam
(74) *Attorney, Agent, or Firm* — Muir Patent Law, PLLC (57) ABSTRACT

A semiconductor device of the disclosure includes a substrate, a capacitor contact structure electrically connected to the substrate, a lower electrode connected to the capacitor contact structure, a capacitor insulating layer covering the lower electrode, and an upper electrode covering the capacitor insulating layer. The upper electrode includes a multiple layer on the capacitor insulating layer, and a cover layer on the multiple layer. The multiple layer includes a first electrode layer, a second electrode layer, and a first metal silicide layer between the first and second electrode layers. A work function of the first metal silicide layer is greater than a work function of the first electrode layer and a work function of the second electrode layer.

20 Claims, 11 Drawing Sheets

SEMICONDUCTOR DEVICE INCLUDING CAPACITOR STRUCTURE AND METHOD FOR MANUFACTURING THE SAME

CROSS-REFERENCE TO THE RELATED APPLICATION(S)

This application claims priority to Korean Patent Application No. 10-2022-0000859, filed on Jan. 4, 2022, in the Korean Intellectual Property Office, the disclosure of which is incorporated herein by reference in its entirety.

BACKGROUND

1. Field

The exemplary embodiments of the disclosure relate to a semiconductor device. More particularly, the exemplary embodiments of the disclosure relate to a semiconductor device including a capacitor structure.

2. Description of the Related Art

Semiconductor devices are being highlighted in electronics industries in accordance with characteristics thereof such as miniaturization, multifunctionalization, low manufacturing costs, etc. Semiconductor devices may be classified into a semiconductor memory device configured to store logic data, a semiconductor logic device configured to arithmetically process logic data, a hybrid semiconductor device including a memory element and a logic element, etc. In accordance with advances in electronics industries, demand for characteristics of semiconductor devices is gradually increasing. For example, demand for high reliability, high speed, multifunctionalization, etc. of semiconductor devices is gradually increasing. In order to satisfy such demanded characteristics, structures in semiconductor devices become more and more complicated. In addition, semiconductor devices become more and more highly integrated.

SUMMARY

The exemplary embodiments of the disclosure provide a semiconductor device including a capacitor structure having enhanced characteristics.

A semiconductor device according to some exemplary embodiments of the disclosure may include a substrate, a capacitor contact structure electrically connected to the substrate, a lower electrode connected to the capacitor contact structure, a capacitor insulating layer covering the lower electrode, and an upper electrode covering the capacitor insulating layer. The upper electrode may include a multiple layer on the capacitor insulating layer, and a cover layer on the multiple layer. The multiple layer may include a first electrode layer, a second electrode layer, and a first metal silicide layer between the first and second electrode layers. A work function of the first metal silicide layer may be greater than a work function of the first electrode layer and a work function of the second electrode layer.

A semiconductor device according to some exemplary embodiments of the disclosure may include a substrate including an active pattern, a gate structure on the active pattern, a bit line structure electrically connected to the active pattern, a capacitor contact structure electrically connected to the active pattern, a lower electrode connected to the capacitor contact structure, a capacitor insulating layer covering the lower electrode, and an upper electrode covering the capacitor insulating layer. The upper electrode may include a first electrode layer, and a first metal silicide layer having a work function greater than a work function of the first electrode layer. The first electrode layer may include a metal nitride. The first metal silicide layer may be disposed between the first electrode layer and the capacitor insulating layer.

A semiconductor device according to some exemplary embodiments of the disclosure may include a substrate, and a capacitor structure electrically connected to the substrate. The capacitor structure may include a lower electrode, an upper electrode, and a capacitor insulating layer between the lower electrode and the upper electrode. The upper electrode may include a first metal silicide layer, and a first electrode layer on the first metal silicide layer. A work function of the first electrode layer may be smaller than a work function of the first metal silicide layer. The first metal silicide layer may be disposed between the first electrode layer and the capacitor insulating layer.

DETAILED DESCRIPTION

Figure 1A:
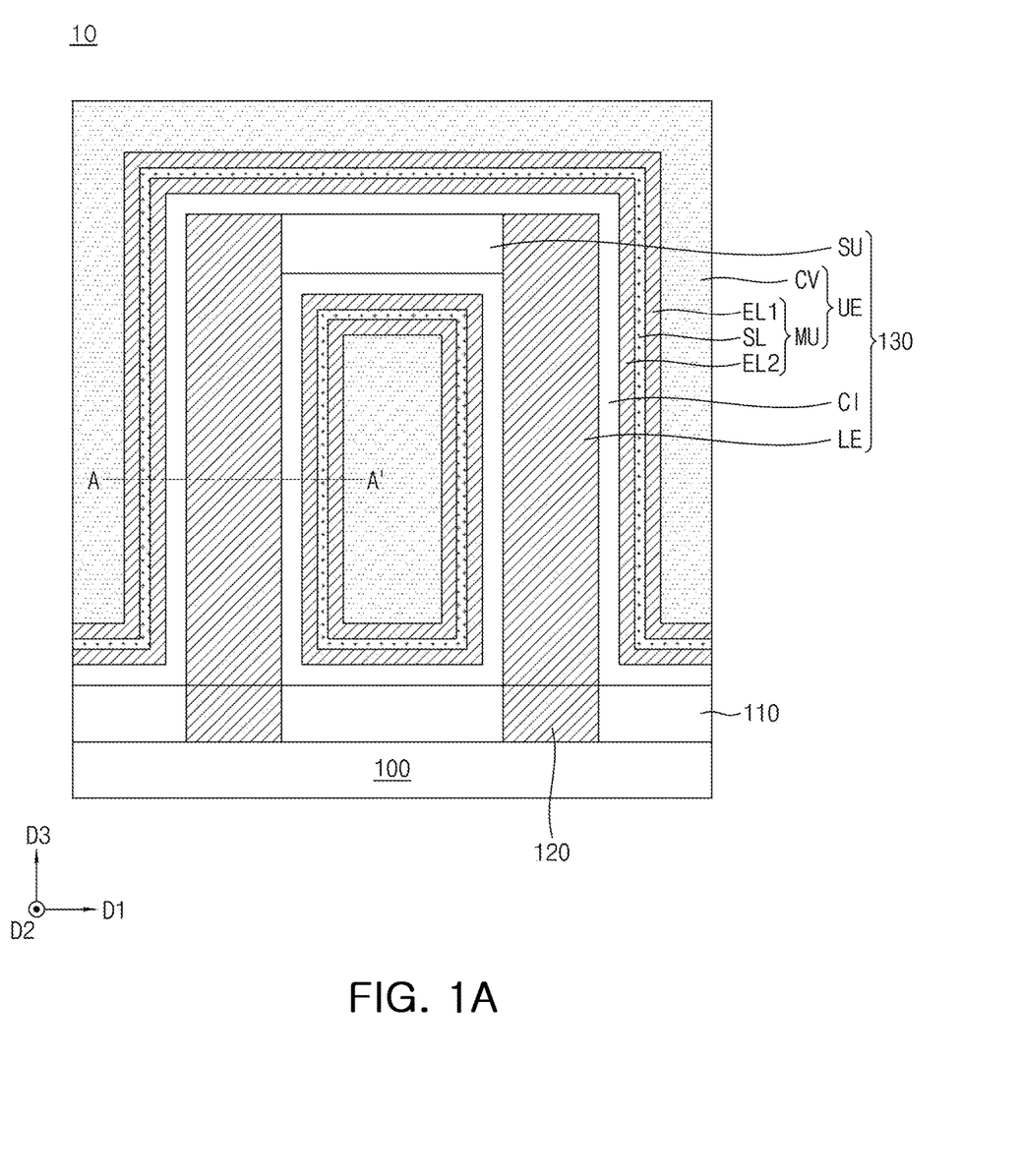
FIG. 1A is a cross-sectional view of a semiconductor device according to some exemplary embodiments of the disclosure.
Figure 1B:
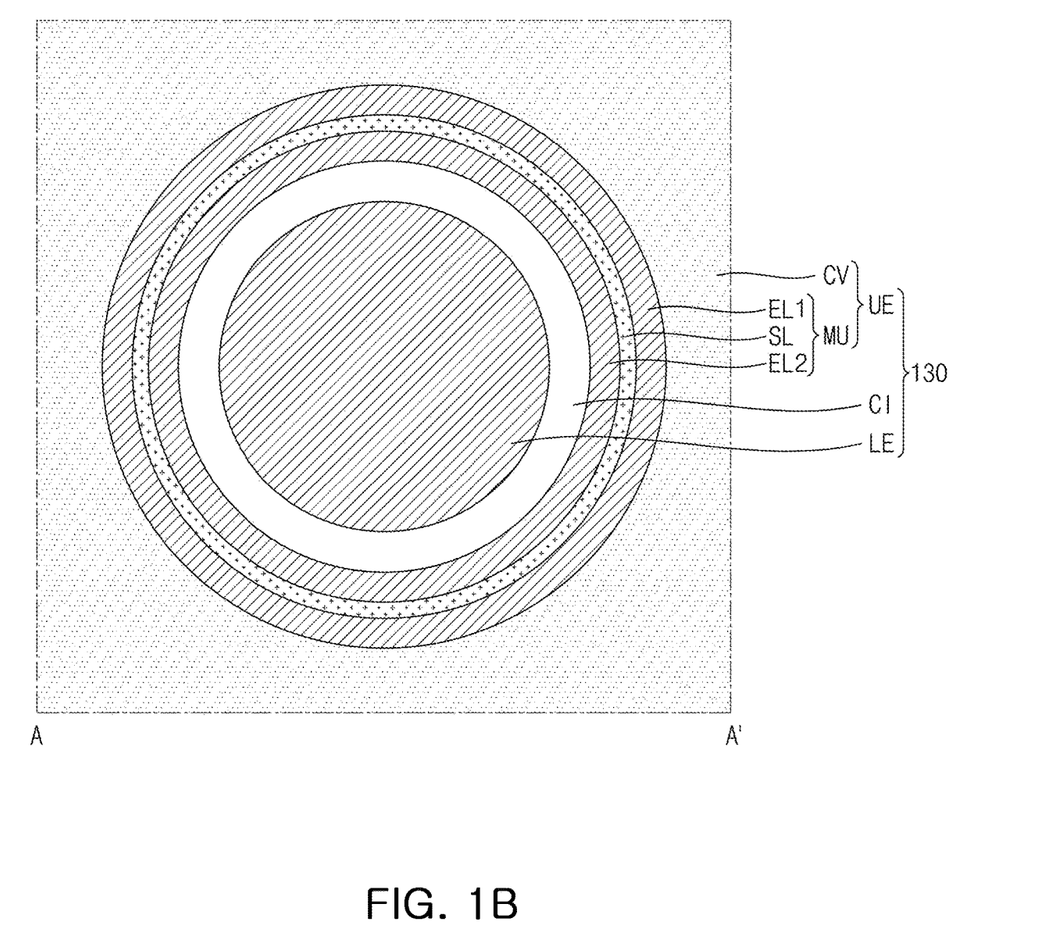
FIG. 1B is a cross-sectional view taken along line A-A' of FIG. 1A according to some exemplary embodiments.

FIG. 1A is a cross-sectional view of a semiconductor device according to some exemplary embodiments of the disclosure. FIG. 1B is a cross-sectional view taken along line A-A' of FIG. 1A according to some exemplary embodiments.

Referring to FIGS. 1A and 1B, a semiconductor device 10 may include a substrate 100.

In some embodiments, the substrate 100 may be a semiconductor substrate. For example, the substrate 100 may include or be formed of silicon, germanium, silicon-germanium, GaP, or GaAs. In some embodiments, the substrate 100 may be a silicon-on-insulator (SOI) substrate or a germanium-on-insulator (GOI) substrate. The substrate 100 may have the form of a plate extending along a plane extending in a first direction D1 and a second direction D2. The first direction D1 and the second direction D2 may intersect each other. For example, the first direction D1 and the second direction D2 may be horizontal directions perpendicularly intersecting each other.

An interlayer insulating layer 110 covering the substrate 100 may be provided. In some embodiments, the interlayer insulating layer 110 may be a multilayer insulating layer including a plurality of insulating layers.

Capacitor contact structures 120 extending through the interlayer insulating layer 110 may be provided. The capacitor contact structures 120 may be electrically connected to the substrate 100. In some embodiments, a capacitor contact structure 120 may be connected to an impurity region formed in the substrate 100. Herein, for convenience of description, the terms of the capacitor contact structures 120 and the capacitor contact structure 120 may be used interchangeably. In some embodiments, each capacitor contact structure 120 may be a multilayer conductive layer including a plurality of conductive layers. The capacitor contact structures 120 may include or be formed of, for example, tungsten.

A capacitor structure 130 may be provided on the interlayer insulating layer 110. The capacitor structure 130 may be electrically connected to the capacitor contact structures 120. The capacitor structure 130 may be electrically connected to the substrate 100 via the capacitor contact structures 120. The capacitor structure 130 may include lower electrodes LE, a capacitor insulating layer CI, a supporter SU, and an upper electrode UE.

The lower electrodes LE may have the form of a pillar extending in a third direction D3. The third direction D3 may intersect the first direction D1 and the second direction D2. For example, the third direction D3 may be a vertical direction perpendicularly intersecting the first direction D1 and the second direction D2. A lower electrode LE may be connected to the capacitor contact structure 120. Herein, for convenience of description, the terms of the lower electrodes LE and the lower electrode LE may be used interchangeably. The supporter SU may support the lower electrodes LE. A sidewall of the supporter SU may contact a sidewall of the lower electrode LE and, as such, the supporter SU may support the sidewall of the lower electrode LE. In some embodiments, a plurality of supporters SU may support one lower electrode LE. In this case, the plurality of supporters SU supporting one lower electrode LE may be disposed at different levels.

The lower electrode LE may include or be formed of a conductive material. For example, the lower electrode LE may include or be formed of at least one of TiN, TiAlN, TiSiN, TaN, TaAlN, TaSiN and WN. The supporter SU may include or be formed of an insulating material. For example, the supporter SU may include or be formed of SiCN.

The capacitor insulating layer CI may cover the lower electrodes LE and the supporter SU. The capacitor insulating layer CI may surround the lower electrodes LE and the supporter SU. The capacitor insulating layer CI may cover the interlayer insulating layer 110. The capacitor insulating layer CI may include or be formed of an insulating material. For example, the capacitor insulating layer CI may include or be formed of a metal oxide, and the metal may be at least one of Nb, Zr, Hf, Al and Ti. In some embodiments, the capacitor insulating layer CI may be a multilayer insulating layer.

In some embodiments, the capacitor insulating layer CI may include a portion surrounded by the lower electrode LE, differently from the shown case. In a process of forming the lower electrode LE, an empty space surrounded by the lower electrode LE may be formed. A portion of the capacitor insulating layer CI may be formed in the empty space and, as such, may be surrounded by the lower electrode LE.

The upper electrode UE may cover the capacitor insulating layer CI. The upper electrode UE may surround the lower electrodes LE, the supporter SU, and the capacitor insulating layer CI. A portion of the capacitor insulating layer CI may be provided between the lower electrode LE and the upper electrode UE. A portion of the capacitor insulating layer CI may be provided between the supporter SU and the upper electrode UE.

The upper electrode UE may include a multiple layer MU, and a cover layer CV on the multiple layer MU. The multiple layer MU may be provided on the capacitor insulating layer CI. The cover layer CV may include or be formed of, for example, SiGe.

The multiple layer MU may include a first electrode layer EL1, a second electrode layer EL2, and a metal silicide layer SL. The metal silicide layer SL may be provided between the first and second electrode layers EL1 and EL2. The second electrode layer EL2 may be provided on the capacitor insulating layer CI, the metal silicide layer SL may be provided on the second electrode layer EL2, and the first electrode layer EL1 may be provided on the metal silicide layer SL. For example, the first electrode layer EL1 may cover the metal silicide layer SL such that the first electrode layer EL1 may protect the metal silicide layer SL to be oxidized by a next process. In some embodiments, a thickness of the metal silicide layer SL may be smaller than a thickness of the first electrode layer EL1 and a thickness of the second electrode layer EL2.

Each of the first electrode layer EL1 and the second electrode layer EL2 may include or be formed of metal nitride. Each of the first and second electrode layers EL1 and EL2 may include or be formed of, for example, at least one of TiN, TiAlN, TiSiN, TaN, TaAlN, TaSiN and WN. The metal silicide layer SL may include or be formed of, for example, at least one of $TiSi_2$, TiSi, $Ti_5Si_3$, $VSi_2$, $CrSi_2$, $FeSi_2$, $CoSi_2$, NiSi, $Ni_2Si$, $Cu_3Si$, $YSi_{1.7}$, $ZrSi_2$, $NbSi_2$, $MoSi_2$, $Pd_2Si$, $HfSi_2$, $TaSi_2$, $WSi_2$, $ReSi_2$, $OsSi_{1.6}$, IrSi, $IrSi_3$, PtSi and $Pt_2Si$.

A work function of the metal silicide layer SL may be greater than a work function of the first electrode layer EL1 and a work function of the second electrode layer EL2. For example, when each of the first and second electrode layers EL1 and EL2 includes or is formed of TiN, the metal silicide layer SL may include or be formed of at least one of $CoSi_2$, NiSi, $Ni_2Si$, $Pd_2Si$, $ReSi_2$, $OsSi_{1.6}$, IrSi, $IrSi_3$, PtSi and $Pt_2Si$. In another example, the work function of the first layer EL1 and the work function of the second electrode layer EL2 may be equal to or less than 4.6 eV, and the work function of the metal silicide layer SL may be more than 4.6 eV.

The semiconductor device 10 according to the exemplary embodiments of the disclosure may have an effect capable of reducing leakage current as the multiple layer MU of the upper electrode UE of the capacitor structure 130 includes the metal silicide layer SL having a relatively great work function.

In the semiconductor device 10 according to the exemplary embodiments of the disclosure, the metal silicide layer SL does not include oxygen and, as such, it may be possible to prevent characteristics of the upper electrode UE from being degraded due to formation of a vacancy in the upper electrode UE by oxygen.

Figure 2:
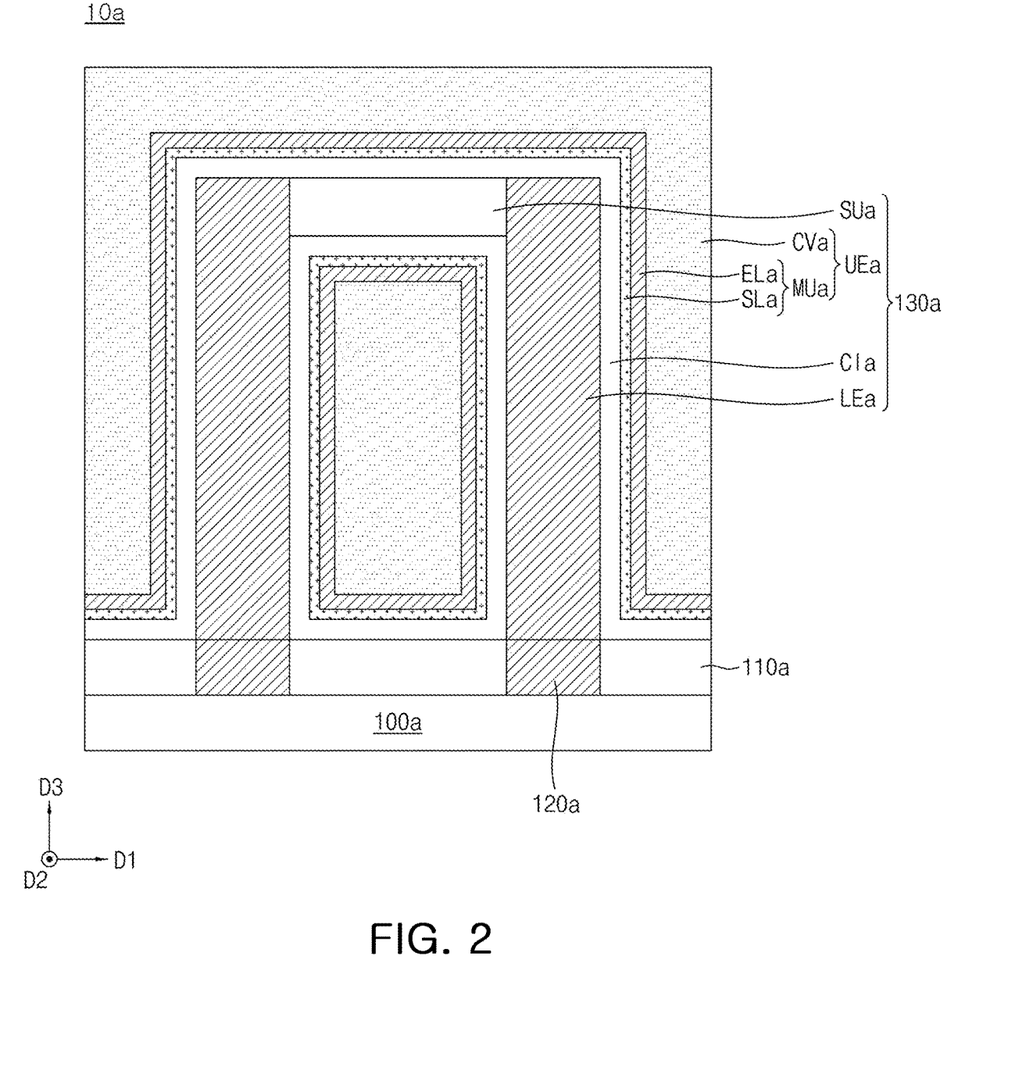
FIG. 2 is a cross-sectional view of a semiconductor device according to exemplary embodiments of the disclosure.

FIG. 2 is a cross-sectional view of a semiconductor device according to exemplary embodiments of the disclosure.

Referring to FIG. 2, a semiconductor device 10a may include a substrate 100a, an interlayer insulating layer 110a, capacitor contact structures 120a, and a capacitor structure 130a. The capacitor structure 130a may include lower electrodes LEa, a supporter SUa, a capacitor insulating layer CIa, and an upper electrode UEa.

The upper electrode UEa may include a multiple layer MUa and a cover layer CVa. The multiple layer MUa of the upper electrode UEa may include a metal silicide layer SLa and an electrode layer ELa. The metal silicide layer SLa may be provided on the capacitor insulating layer CIa, and the electrode layer ELa may be provided on the metal silicide layer SLa. For example, the electrode layer ELa may cover the metal silicide layer SLa such that the first electrode layer ELa may protect the metal silicide layer SLa to be oxidized by a next process. A work function of the metal silicide layer SLa may be greater than a work function of the electrode layer ELa.

Figure 3:
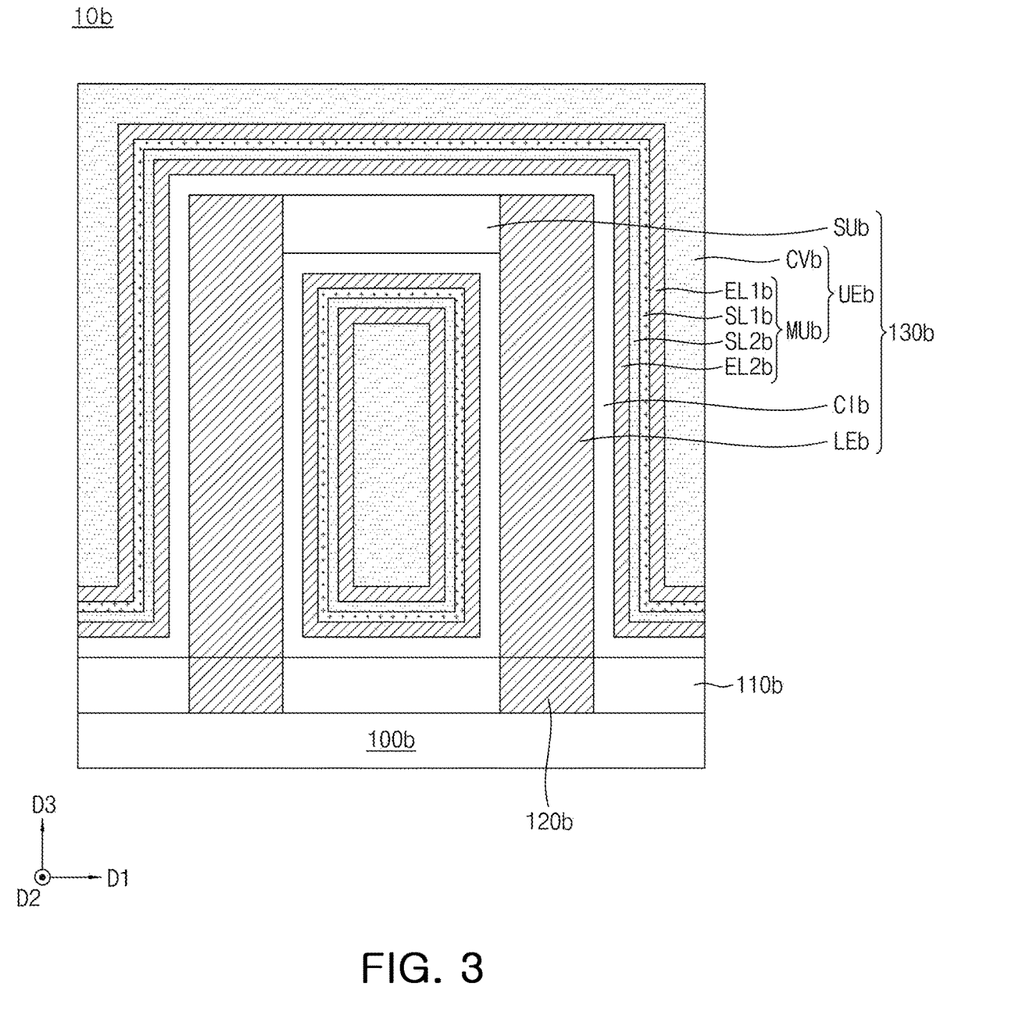
FIG. 3 is a cross-sectional view of a semiconductor device according to some exemplary embodiments of the disclosure.

FIG. 3 is a cross-sectional view of a semiconductor device according to some exemplary embodiments of the disclosure.

Referring to FIG. 3, a semiconductor device 10b may include a substrate 100b, an interlayer insulating layer 110b, capacitor contact structures 120b, and a capacitor structure 130b. The capacitor structure 130b may include lower electrodes LEb, a supporter SUb, a capacitor insulating layer CIb, and an upper electrode UEb.

The upper electrode UEb may include a multiple layer MUb and a cover layer CVb. The multiple layer MUb of the upper electrode UEb may include a first electrode layer EL1b, a second electrode layer EL2b, a first metal silicide layer SL1b, and a second metal silicide layer SL2b. The second electrode layer EL2b may be provided on the capacitor insulating layer CIb, the second metal silicide layer SL2b may be provided on the second electrode layer EL2b, the first metal silicide layer SL1b may be provided on the second metal silicide layer SL2b, and the first electrode layer EL1b may be provided on the first metal silicide layer SL1b. For example, the first electrode layer EL1b may cover the first metal silicide layer SL1b such that the first electrode layer EL1b may protect the first metal silicide layer SL1b to be oxidized by a next process. The first and second metal silicide layers SL1b and SL2b may be provided between the first and second electrode layers EL1b and EL2b.

A work function of each of the first and second metal silicide layers SL1b and SL2b may be greater than a work function of each of the first and second electrode layers EL1b and EL2b. Each of the first and second metal silicide layers SL1b and SL2b may include or be formed of a different material. The work function of the first metal silicide layer SL1b may be different from the work function of the second metal silicide layer SL2b. For example, when the first metal silicide layer SL1b includes or is formed of IrSi, the second metal silicide layer SL2b may include or be formed of PtSi having a work function different from that of IrSi.

Figure 4:
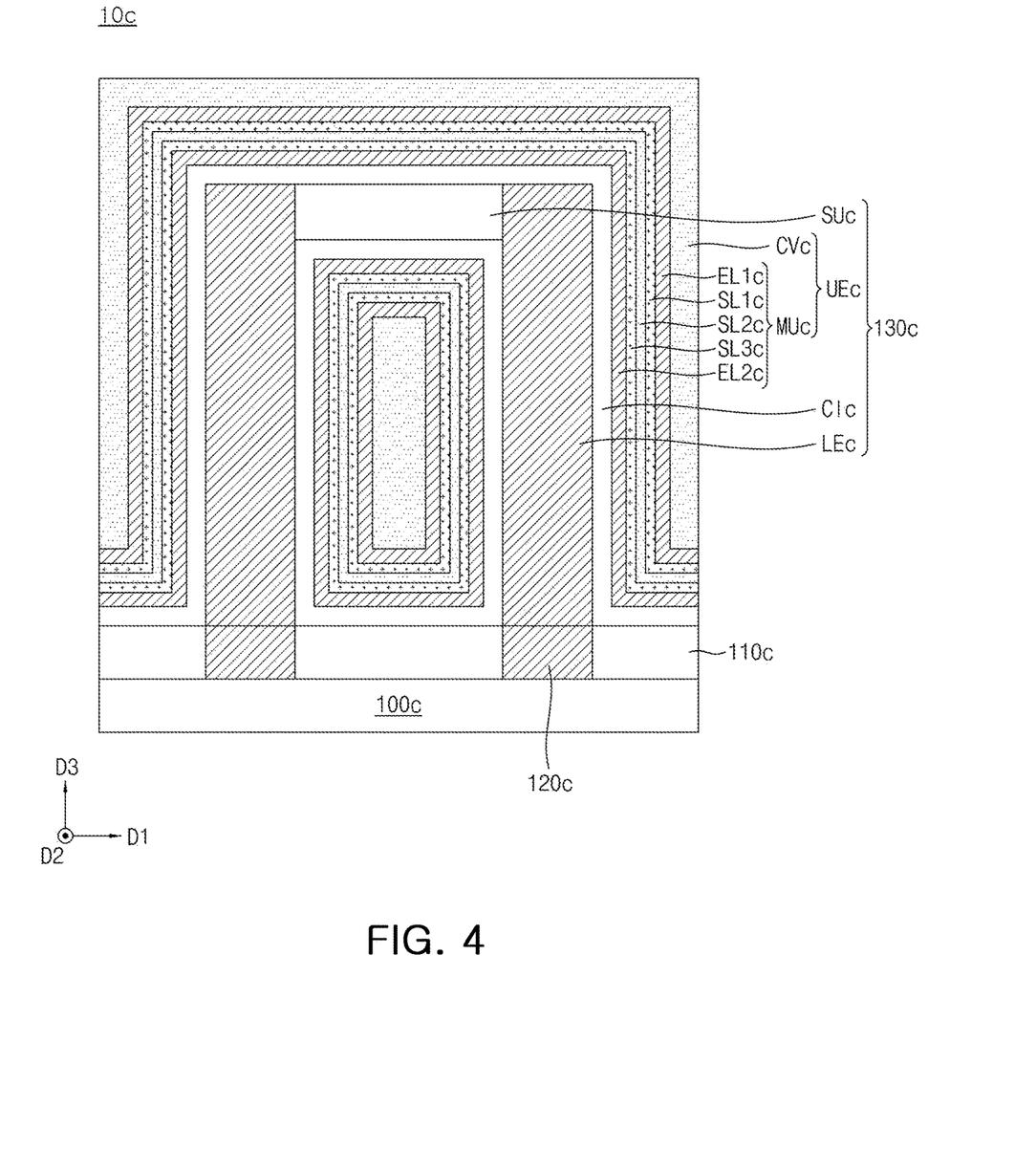
FIG. 4 is a cross-sectional view of a semiconductor device according to some exemplary embodiments of the disclosure.

FIG. 4 is a cross-sectional view of a semiconductor device according to some exemplary embodiments of the disclosure.

Referring to FIG. 4, a semiconductor device 10c may include a substrate 100c, an interlayer insulating layer 110c, capacitor contact structures 120c, and a capacitor structure 130c. The capacitor structure 130c may include lower electrodes LEc, a supporter SUc, a capacitor insulating layer CIc, and an upper electrode UEc.

The upper electrode UEc may include a multiple layer MUc and a cover layer CVc. The multiple layer MUc of the upper electrode UEc may include a first electrode layer EL1c, a second electrode layer EL2c, a first metal silicide layer SL1c, a second metal silicide layer SL2c, and a third metal silicide layer SL3c. The second electrode layer EL2c may be provided on the capacitor insulating layer CIc, the third metal silicide layer SL3c may be provided on the second electrode layer EL2c, the second metal silicide layer SL2c may be provided on the third metal silicide layer SL3c, the first metal silicide layer SL1c may be provided on the second metal silicide layer SL2c, and the first electrode layer EL1c may be provided on the first metal silicide layer SL1c. For example, the first electrode layer EL1c may cover the first metal silicide layer SL1c such that the first electrode layer EL1c may protect the first metal silicide layer SL1c to be oxidized by a next process. The first to third metal silicide layers SL1c, SL2c and SL3c may be provided between the first and second electrode layers EL1c and EL2c.

A work function of each of the first to third metal silicide layers SL1c, SL2c and SL3c may be greater than a work function of each of the first and second electrode layers EL1c and EL2c. Each of the first and second silicide layers SL1c and SL2c may include or be formed of a different materials. In this case, the work function of the first metal silicide layer SL1c may be different from the work function of the second metal silicide layer SL2c. Each of the second and third metal silicide layers SL2c and SL3c may include or be formed of a different material. In this case, the work function of the second metal silicide layer SL2c may be different from the work function of the third metal silicide layer SL3c. Each of the first and third metal silicide layers SL1c and SL3c may include or be formed of the same material. In this case, a work function of each of the first and third metal silicide layers SL1c and SL3c may be the same as each other.

In some embodiments, each of the first to third metal silicide layers SL1c, SL2c and SL3c may include or be formed of the same material. A work function of each of the first to third metal silicide layers SL1c, SL2c and SL3c may be the same as each other.

In some embodiments, each of the first to third metal silicide layers SL1c, SL2c and SL3c may include or be formed of a different material. The work function of each of the first to third metal silicide layer SL1c, SL2c and SL3c may be different from each other.

Figure 5A:
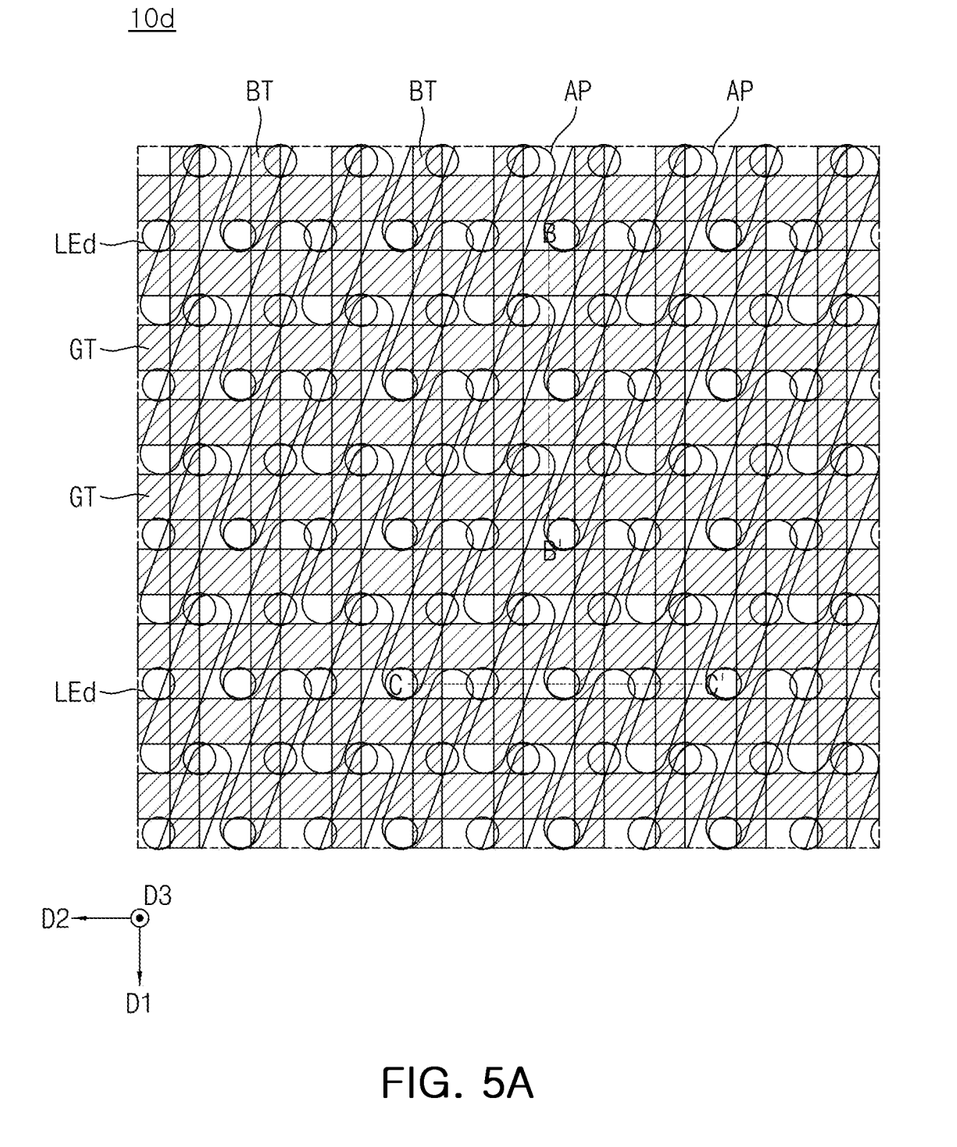
FIG. 5A is a plan view of a semiconductor device according to exemplary embodiments of the disclosure.
Figure 5B:
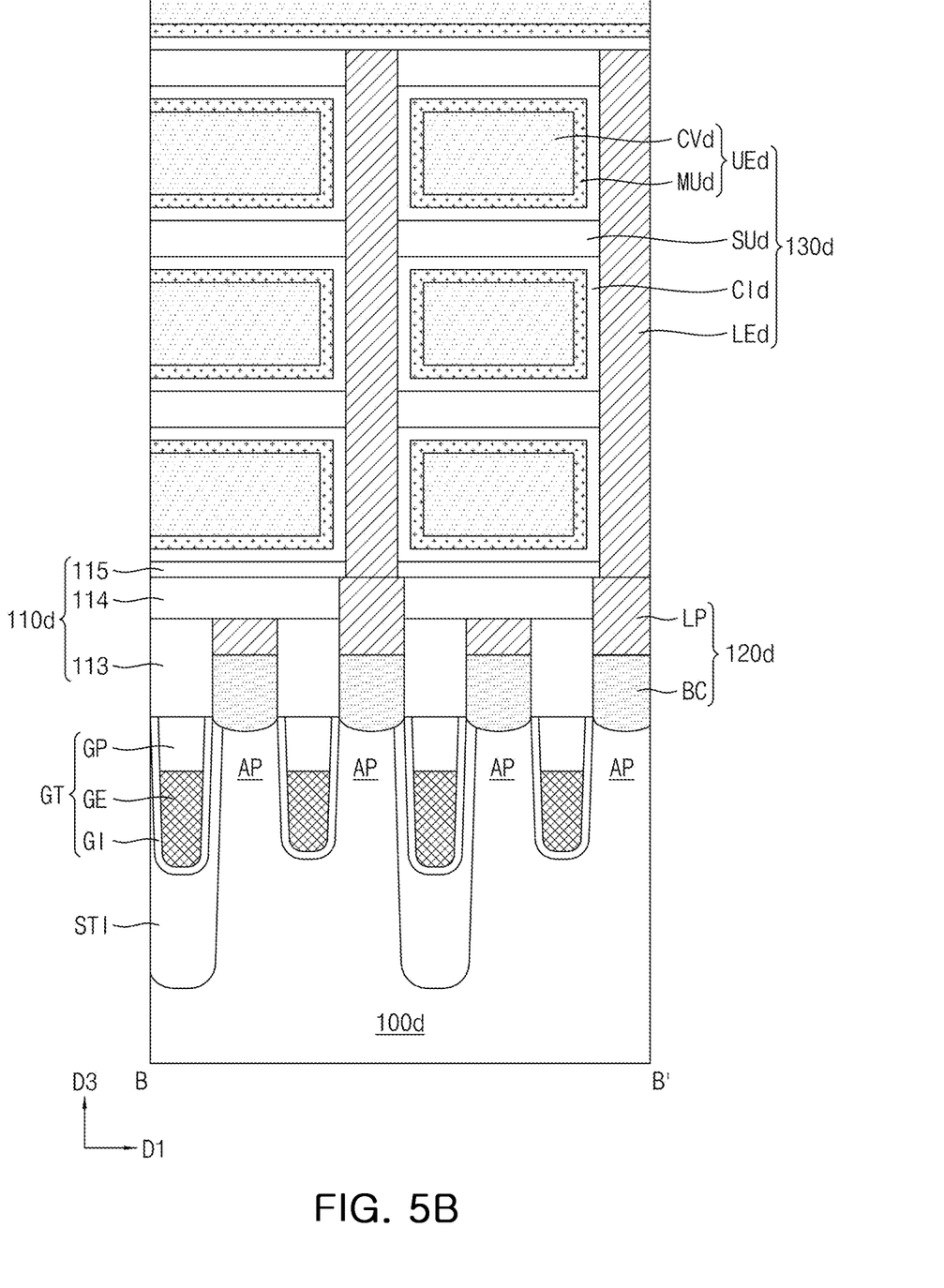
FIG. 5B is a cross-sectional view taken along line B-B' in FIG. 5A according to some exemplary embodiments.
Figure 5C:
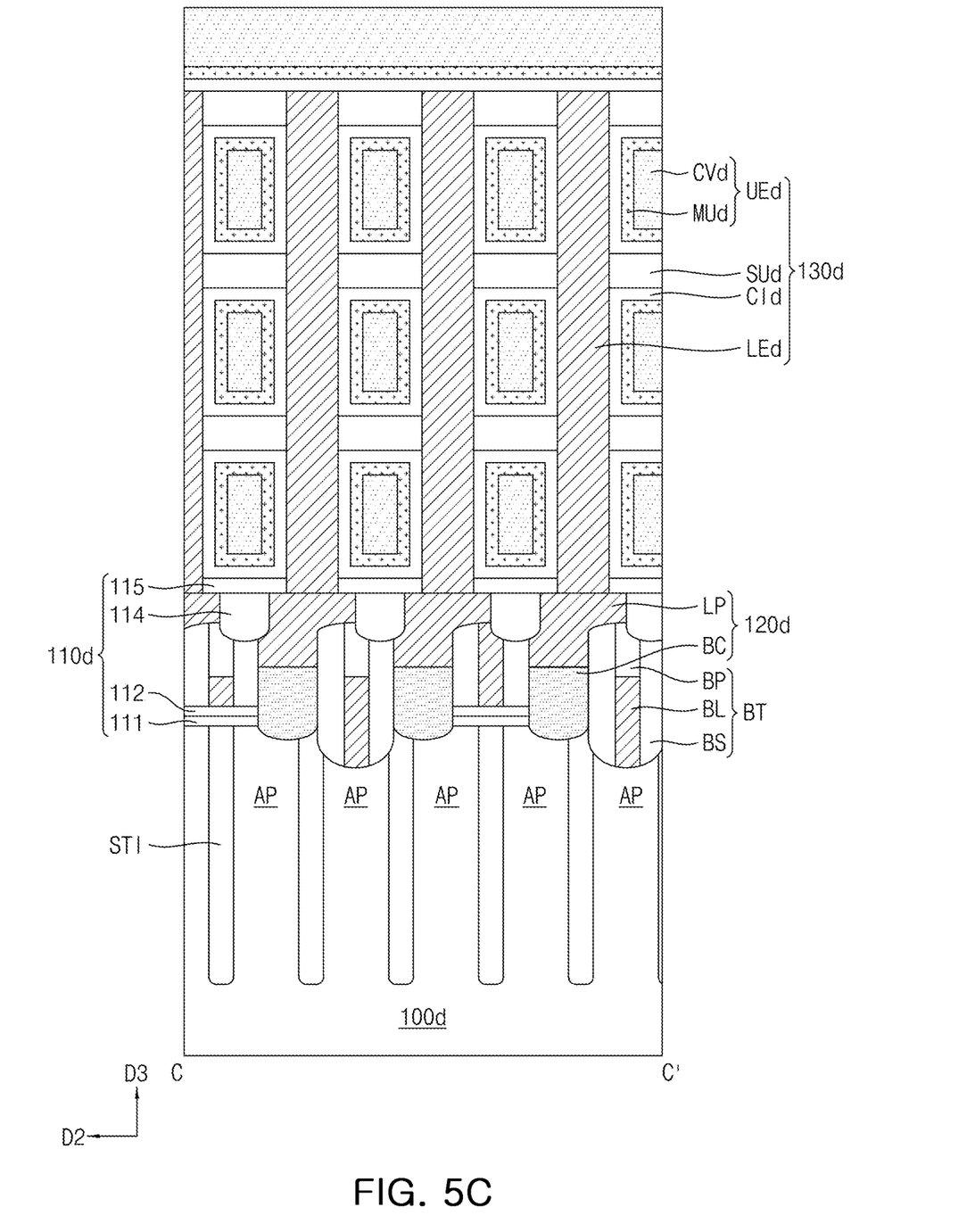
FIG. 5C is a cross-sectional view taken along line C-C' in FIG. 5A according to some exemplary embodiments.

FIG. 5A is a plan view of a semiconductor device according to exemplary embodiments of the disclosure. FIG. 5B is a cross-sectional view taken along line B-B' in FIG. 5A. FIG. 5C is a cross-sectional view taken along line C-C' in FIG. 5A.

Referring to FIGS. 5A, 5B and 5C, a semiconductor device 10d may include a substrate 100d.

The substrate 100d may include active patterns AP. Upper portions of the substrate 100d protruding in a third direction D3 may be defined as the active patterns AP. The active patterns AP may be spaced apart from one another.

An element isolation layer STI may be provided in a space provided among the active patterns AP. The active patterns AP may be defined by the element isolation layer STI. Each of the active patterns AP may be surrounded by the element isolation layer STI. The element isolation layer STI may include or be formed of an insulating material. For example, the element isolation layer STI may include an oxide.

Gate structures GT extending in a second direction D2 may be provided. The gate structures GT may be spaced apart from one another in a first direction D1. A gate structure GT may be provided on the active patterns AP and the element isolation layer STI. Herein, for convenience of description, the terms of the gate structures GT and the gate structure GT may be used interchangeably. The gate structure GT may be a buried gate structure buried in the active patterns AP and the element isolation layer STI. The active patterns AP may include impurity regions. A cell transistor including the gate structure GT and the impurity regions of the active pattern AP may be defined.

Each of the gate structures GT may include a gate insulating layer GI, a gate electrode GE, and a gate capping layer GP. The gate insulating layer GI may cover surfaces of the active patterns AP and the element isolation layer STI. The gate electrode GE and the gate capping layer GP may be provided inside the gate insulating layer GI. The gate electrode GE may be spaced apart from the active pattern AP by the gate insulating layer GI. The gate capping layer GP may cover a top surface of the gate electrode GE. Each of the gate insulating layer GI and the gate capping layer GP may include or be formed of an insulating material. The gate electrode GE may include or be formed of a conductive material.

Bit line structures BT extending in the first direction D1 may be provided. The bit line structures BT may be spaced apart from one another in the second direction D2. The bit line structure BT may be electrically connected to the active pattern AP.

Each of the bit line structures BT may include a bit line BL, a bit line capping layer BP, and bit line spacers BS. The bit line BL may be connected to the active pattern AP. The bit line BL may include or be formed of a conductive material. The bit line capping layer BP may be provided on the bit line BL. The bit line capping layer BP may include or be formed of an insulating material. The bit line spacers BS may be provided at opposite sides of the bit line BL and the bit line capping layer BP. The bit line spacers BS may include or be formed of an insulating material.

An interlayer insulating layer 110$d$ covering the substrate 100$d$, the gate structures GT and the bit line structures BT may be provided. The interlayer insulating layer 110$d$ may include first and second insulating patterns 111 and 112, insulating fences 113, a separation pattern 114, and an etch stop layer 115.

Capacitor contact structures 120$d$, which are connected to the active patterns AP of the substrate 100$d$, may be provided. Each of the capacitor contact structures 120$d$ may include a buried contact BC and a landing pad LP.

First and second insulating patterns 111 and 112 may be provided on the substrate 100$d$. The second insulating pattern 112 may be provided on the first insulating pattern 111. Each of the first and second insulating patterns 111 and 112 may include or be formed of different insulating materials, respectively.

The insulating fences 113 may be provided on the gate capping layer GP of the gate structure GT. The insulating fence 113 may be provided between adjacent ones of the bit line structures BT. The insulating fence 120 may include or be formed of an insulating material.

The buried contact BC may be connected to the active pattern AP. The buried contact BC may be provided between adjacent ones of the insulating fences 113. The buried contact BC may include or be formed of a conductive material.

The landing pad LP may be provided on the buried contact BC. The landing pad LP may be provided between adjacent ones of the insulating fences 113. The landing pad LP may be electrically connected to the active pattern AP via the buried contact BC. The landing pad LP may include or be formed of a conductive material. In some embodiments, the landing pad LP may include a diffusion barrier layer. In some embodiments, a metal silicide layer may be provided between the landing pad LP and the buried contact BC.

The separation pattern 114 may be provided on the bit line structures BT and the insulating fences 113. The separation pattern 114 may space the landing pads LP apart from one another. The separation pattern 114 may include or be formed of an insulating material.

The etch stop layer 115 may be provided on the separation pattern 114. The etch stop layer 115 may include or be formed of an insulating material.

A capacitor structure 130$d$ may be provided on the etch stop layer 115. The capacitor structure 130$d$ may include lower electrodes LEd, a capacitor insulating layer CId, supporters SUd, and an upper electrode UEd. The capacitor structure 130$d$ may be connected to the landing pad LP. The capacitor structure 130$d$ may be electrically connected to the active pattern AP via the landing pad LP and the buried contact BC.

The upper electrode UEd may include a multiple layer MUd on the capacitor insulating layer CId, and a cover layer CVd on the multiple layer MUd. The multiple layer MUd may include at least one electrode layer and at least one metal silicide layer. The metal silicide layer may have a greater work function than the at least one electrode layer.

Figure 6A:
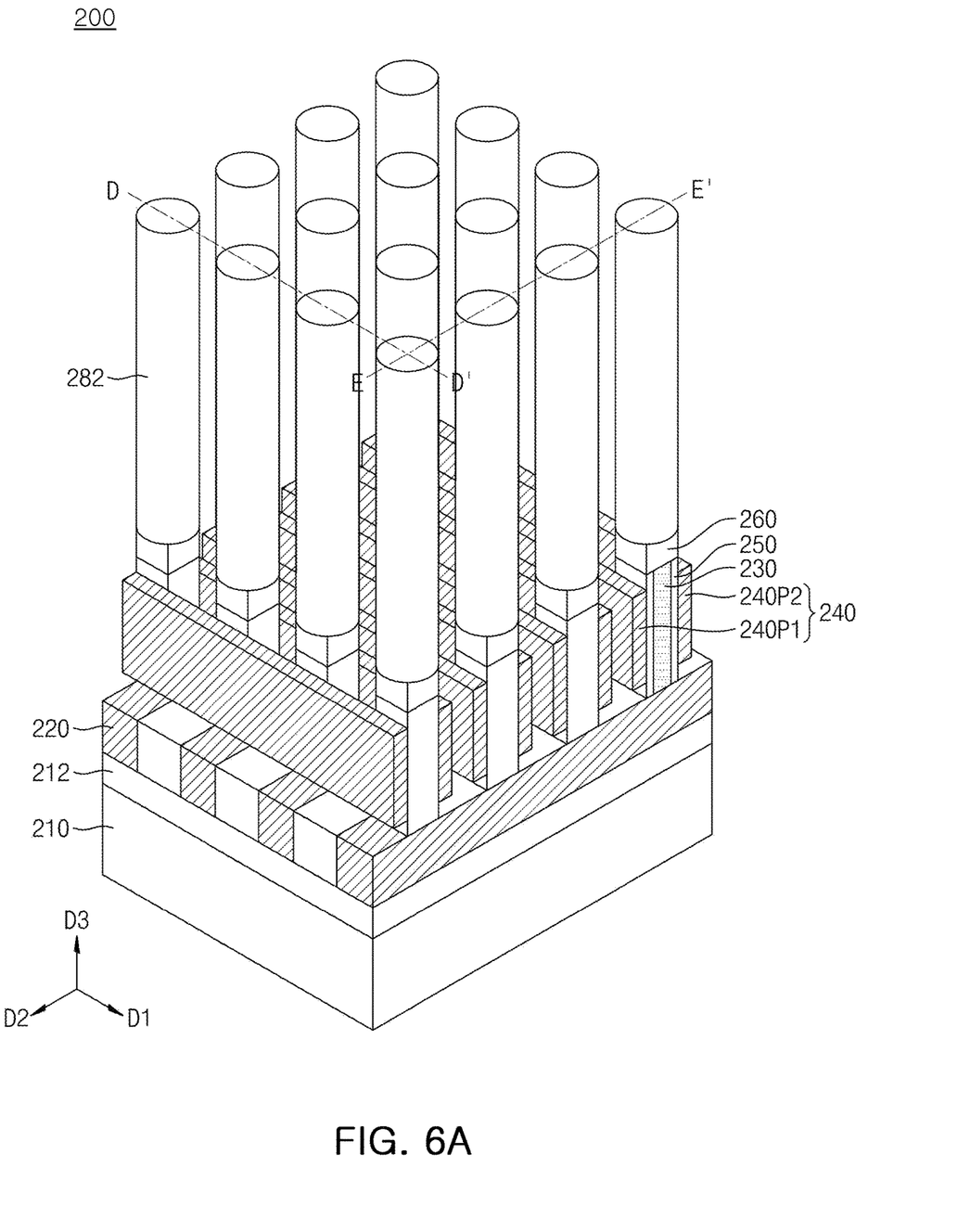
FIG. 6A is a perspective view of a semiconductor device according to some exemplary embodiments of the disclosure.
Figure 6B:
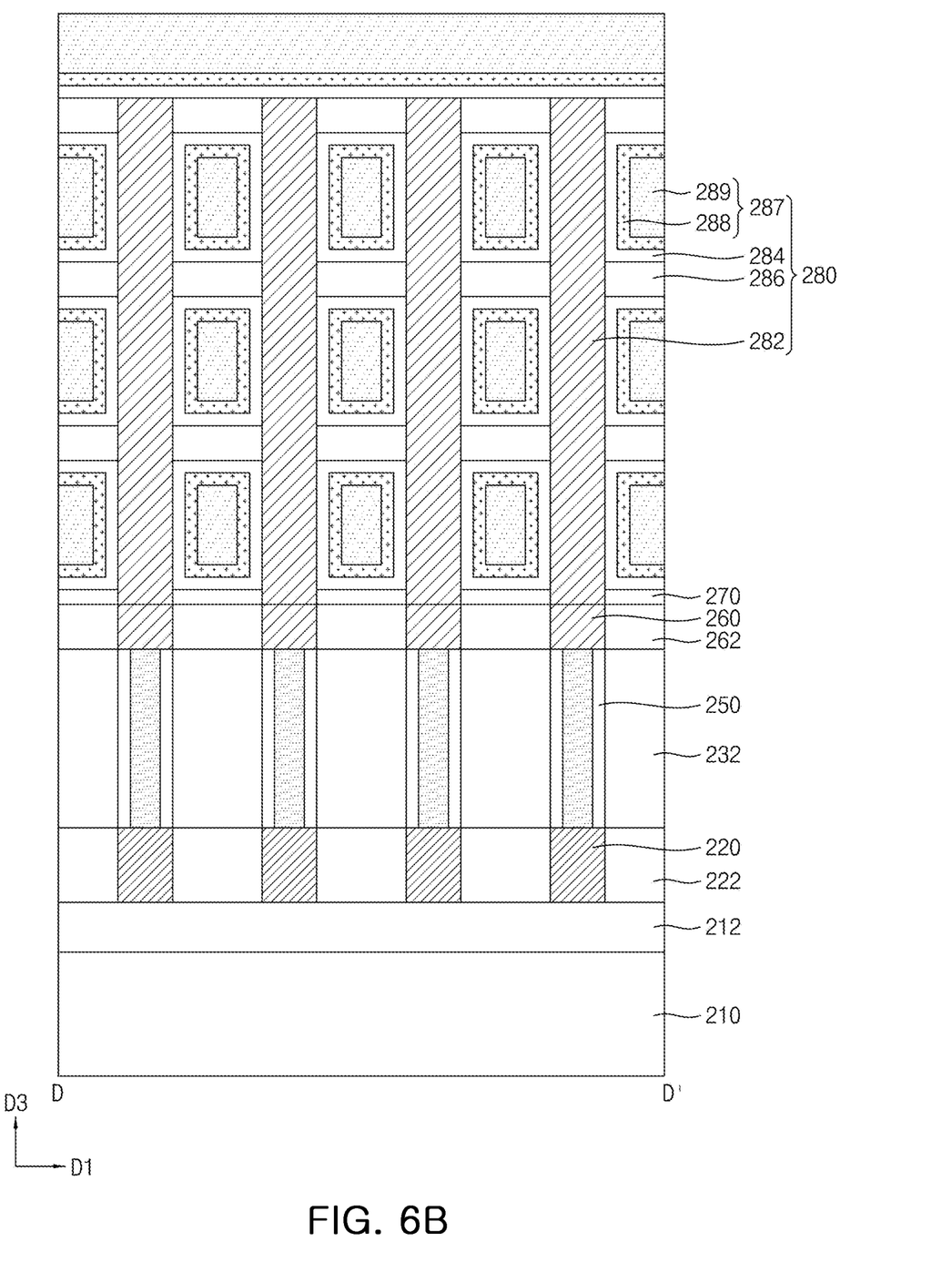
FIG. 6B is a cross-sectional view taken along line D-D' of FIG. 6A according to some exemplary embodiments.
Figure 6C:
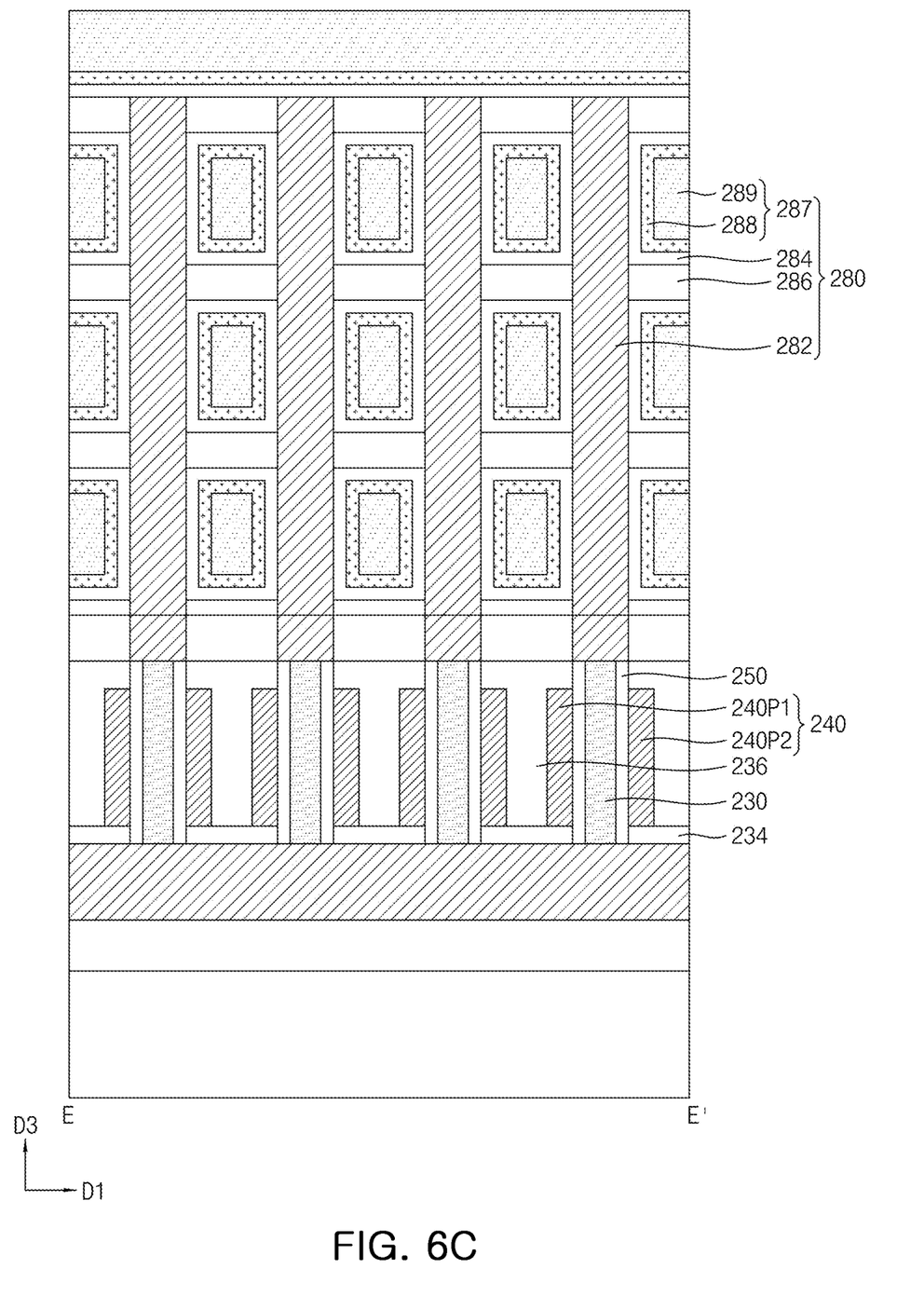
FIG. 6C is a cross-sectional view taken along line E-E' of FIG. 6A according to some exemplary embodiments.

FIG. 6A is a perspective view of a semiconductor device according to some exemplary embodiments of the disclosure. FIG. 6B is a cross-sectional view taken along line D-D' of FIG. 6A. FIG. 6C is a cross-sectional view taken along line E-E' of FIG. 6A.

Referring to FIGS. 6A, 6B, and 6C, a semiconductor device 200 may include a substrate 210, a plurality of first conductive lines 220, a channel layer 230, a gate electrode 240, a gate insulating layer 250, and a capacitor structure 280. The semiconductor device 200 may be a memory device including a vertical channel transistor (VCT). The vertical channel transistor may represent a structure in which a channel length of the channel layer 230 extends from the substrate 210 in a vertical direction.

A lower insulating layer 212 may be disposed on the substrate 210, and the plurality of first conductive lines 220 may be disposed on the lower insulating layer 212 under a condition that the plurality of first conductive lines 220 is spaced apart from one another in a first direction D1 while extending in a second direction D2. A plurality of first insulating structures 222 may be disposed on the lower insulating layer 212, to fill a space among the plurality of first conductive lines 220. The plurality of first insulating structures 222 may extend in the second direction D2, and a top surface of the plurality of first insulating structures 222 may be disposed at the same level as a top surface of the plurality of first conductive lines 220. The plurality of first conductive lines 220 may function as a bit line of the semiconductor device 200.

In some embodiments, each of the plurality of first conductive lines 220 may include or be formed of doped polysilicon, a metal, a conductive metal nitride, a conductive metal silicide, a conductive metal oxide, or a combination thereof. For example, each of the plurality of first conductive lines 220 may be constituted by doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, IrO$_x$, RuO$_x$, or a combination thereof, without being limited thereto. Each of the plurality of first conductive lines 220 may include a single layer or multiple layer of the above-described materials. In some embodiments, each of the plurality of first conductive lines 220 may include a two-dimensional semiconductor material and, for example, the two-dimensional semiconductor material may include graphene, carbon nanotubes, or a combination thereof.

Channel layers 230 may be arranged on the plurality of first conductive lines 220 in the form of a matrix in which the channel layers 230 are spaced apart from one another in the first direction D1 and the second direction D2. Herein, for convenience of description, the terms of the channel layer 230 and the channel layers 230 may be used interchangeably. The channel layer 230 may have a first width in the first direction D1 and a first height in a third direction D3, and the first height may be greater than the first width. For example, the first height may be about 2 to 10 times the first width, without being limited thereto. A bottom portion of the channel layer 230 may function as a first source/drain region (not shown), an upper portion of the channel layer 230 may function as a second source/drain region (not shown), and a portion of the channel layer 230 between the first and second source/drain regions may function as a channel region (not shown).

In some embodiments, the channel layer 230 may include or be formed of an oxide semiconductor and, for example, the oxide semiconductor may include or be formed of $In_xGa_yZn_zO$, $In_xGa_ySi_zO$, $In_xSn_yZn_zO$, $In_xZn_yO$, $Zn_xO$, $Zn_xSn_yO$, $Zn_xO_yN$, $Zr_xZn_ySn_zO$, $Sn_xO$, $Hf_xIn_yZn_zO$, $Ga_xZn_ySn_zO$, $Al_xZn_ySn_zO$, $Yb_xGa_yZn_zO$, $In_xGa_yO$, or a combination thereof. The channel layer 230 may include a single layer or multiple layer of the oxide semiconductor. In some embodiments, the channel layer 230 may have greater bandgap energy than silicon. For example, the channel layer 230 may have bandgap energy of about 1.5 to 5.6 eV. For example, the channel layer 230 may have optimum channel performance when the channel layer 230 has bandgap energy of about 2.0 to 4.0 eV. For example, the channel layer 230 may be polycrystalline or amorphous, without being limited thereto. In some embodiments, the channel layer 230 may include or be formed of a two-dimensional semiconductor material and, for example, the two-dimensional semiconductor material may include or be formed of graphene, carbon nanotubes, or a combination thereof.

The gate electrode 240 may extend in the first direction D1 on opposite sidewalls of the channel layer 230. The gate electrode 240 may include a first sub-gate electrode 240P1 facing a first sidewall of the channel layer 230, and a second sub-gate electrode 240P2 facing a second sidewall of the channel layer 230 opposing the first sidewall. As one channel layer 230 is disposed between the first sub-gate electrode 240P1 and the second sub-gate electrode 240P2, the semiconductor device 200 may have a dual gate transistor structure. However, the exemplary embodiments of the disclosure are not limited to the above-described case, and a single gate transistor structure may be embodied by omitting the second sub-gate electrode 240P2, and forming only the first sub-gate electrode 240P1 facing the first sidewall of the channel layer 230.

The gate electrode 240 may include or be formed of doped polysilicon, a metal, a conductive metal nitride, a conductive metal silicide, a conductive metal oxide, or a combination thereof. The gate electrode 240 may be constituted by doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, without being limited thereto.

The gate insulating layer 250 may surround a sidewall of the channel layer 230, and may be interposed between the channel layer 230 and the gate electrode 240. For example, the entire sidewall of the channel layer 230 may be surrounded by the gate insulating layer 250, and a portion of a sidewall of the gate electrode 240 may contact the gate insulating layer 250. In some embodiments, the gate insulating layer 250 may extend in an extension direction of the gate electrode 240, and only two sidewalls facing the gate electrode 240 from among sidewalls of the channel layer 230 may contact the gate insulating layer 250.

In some embodiments, the gate insulating layer 250 may be constituted by a silicon oxide layer, a silicon oxynitride layer, a high-k dielectric layer having a higher dielectric constant than the silicon oxide layer, or a combination thereof. The high-k dielectric layer may be constituted by a metal oxide or a metal oxynitride. For example, the high-k dielectric layer, which is usable as the gate insulating layer 250, may be constituted by $HfO_2$, HfSiO, HfSiON, HfTaO, HfTiO, HfZrO, $ZrO_2$, $Al_2O_3$, or a combination thereof, without being limited thereto.

A plurality of second insulating structures 232 may extend on the plurality of first insulating structures 222 in the second direction D2, and the channel layer 230 may be disposed between two adjacent second insulating structures 232 from among the plurality of second insulating structures 232. In addition, between the two adjacent second insulating structures 232, a first buried layer 234 and a second buried layer 236 may be disposed in a space between two adjacent channel layers 230. The first buried layer 234 may be disposed at a bottom portion of the space between the two adjacent channel layers 230, and the second buried layer 236 may be formed on the first buried layer 234, to fill a remaining portion of the space between the two adjacent channel layers 230. A top surface of the second buried layer 236 may be disposed at the same level as a top surface of the channel layer 230, and the second buried layer 236 may cover a top surface of the gate electrode 240. Otherwise, the plurality of second insulating structures 232 may be formed by a material layer in continuity with the plurality of first insulating structures 222, or the second buried layer 236 may be formed by a material layer in continuity with the first buried layer 234.

A capacitor contact structure 260 may be disposed on the channel layer 230. The capacitor contact structure 260 may be disposed to vertically overlap with the channel layer 230. Capacitor contact structures 260 may be arranged in the form of a matrix in which the capacitor contact structures 260 are spaced apart from one another in the first direction D1 and the second direction D2. Herein, for convenience of description, the terms of the capacitor contact structures 260 and the capacitor contact structure 260 may be used interchangeably. The capacitor contact structure 260 may be constituted by doped polysilicon, Al, Cu, Ti, Ta, Ru, W, Mo, Pt, Ni, Co, TiN, TaN, WN, NbN, TiAl, TiAlN, TiSi, TiSiN, TaSi, TaSiN, RuTiN, NiSi, CoSi, $IrO_x$, $RuO_x$, or a combination thereof, without being limited thereto. The upper insulating layer 262 may surround a sidewall of the capacitor contact structure 260 on the plurality of second insulating structures 232 and the second buried layer 236.

An etch stop layer 270 may be disposed on the upper insulating layer 262, and a capacitor structure 280 may be disposed on the etch stop layer 270. The capacitor structure 280 may include lower electrodes 282, a capacitor insulating layer 284, supporters 286, and an upper electrode 287. The upper electrode 287 may include a multiple layer 288 on the capacitor insulating layer 284, and a cover layer 289 on the multiple layer 288. The multiple layer 288 may include at least one electrode layer and at least one metal silicide layer. The work function of the metal silicide layer may be greater than the work function of the at least one electrode layer.

A lower electrode 282 may be electrically connected to a top surface of the contact structure 260 while extending through the etch stop layer 270. Herein, for convenience of description, the terms of the lower electrode 282 and the lower electrodes 282 may be used interchangeably. In some embodiments, the lower electrode 282 may be disposed to vertically overlap with the capacitor contact structure 260. The lower electrodes 282 may be arranged in the form of a matrix in which the lower electrodes 282 are spaced apart from one another in the first direction D1 and the second direction D2.

In the semiconductor device 10, 10a to 10d, and 200, according to the exemplary embodiments of the disclosure, an upper electrode of a capacitor structure may include a metal silicide layer and, as such, it may be possible to obtain an effect of reducing leakage current through an upper electrode without causing degradation of characteristics of the upper electrode.

While the embodiments of the disclosure have been described with reference to the accompanying drawings, it should be understood by those skilled in the art that various modifications may be made without departing from the scope of the disclosure as set forth by the appending claims. Therefore, the above-described embodiments should be considered in a descriptive sense only and not for purposes of limitation.

What is claimed is:

1. A semiconductor device comprising:
a substrate;
a capacitor contact structure electrically connected to the substrate;
a lower electrode connected to the capacitor contact structure;
a capacitor insulating layer covering the lower electrode; and
an upper electrode covering the capacitor insulating layer,
wherein the upper electrode comprises a multiple layer on the capacitor insulating layer, and a cover layer on the multiple layer,
wherein the multiple layer comprises a first electrode layer, a second electrode layer, and a first metal silicide layer between the first and second electrode layers, and
wherein a work function of the first metal silicide layer is greater than a work function of the first electrode layer and a work function of the second electrode layer.

2. The semiconductor device according to claim 1, wherein each of the first and second electrode layers comprises a metal nitride.

3. The semiconductor device according to claim 1, wherein the first metal silicide layer comprises one of $TiSi_2$, TiSi, $Ti_5Si_3$, $VSi_2$, $CrSi_2$, $FeSi_2$, $CoSi_2$, NiSi, $Ni_2Si$, $Cu_3Si$, $YSi_{1.7}$, $ZrSi_2$, $NbSi_2$, $MoSi_2$, $Pd_2Si$, $HfSi_2$, $TaSi_2$, $WSi_2$, $ReSi_2$, $OsSi_{1.6}$, IrSi, $IrSi_3$, PtSi or $Pt_2Si$.

4. The semiconductor device according to claim 1, wherein the cover layer comprises SiGe.

5. The semiconductor device according to claim 1, wherein:
the multiple layer further comprises a second metal silicide layer between the first metal silicide layer and the second electrode layer,
a work function of the second metal silicide layer is different from the work function of the first metal silicide layer, and
the work function of the second metal silicide layer is greater than the work function of the first electrode layer and the work function of the second electrode layer.

6. The semiconductor device according to claim 5, wherein:
the multiple layer further comprises a third metal silicide layer between the second metal silicide layer and the second electrode layer,
a work function of the third metal silicide layer is different from the work function of the second metal silicide layer, and
the work function of the third metal silicide layer is greater than the work function of the first electrode layer and the work function of the second electrode layer.

7. The semiconductor device according to claim 6, wherein each of the first and third metal silicide layers comprises the same material.

8. A semiconductor device comprising:
a substrate comprising an active pattern;
a gate structure on the active pattern;
a bit line structure electrically connected to the active pattern;
a capacitor contact structure electrically connected to the active pattern;
a lower electrode connected to the capacitor contact structure;
a capacitor insulating layer covering the lower electrode; and
an upper electrode covering the capacitor insulating layer,
wherein the upper electrode comprises a first electrode layer, and a first metal silicide layer having a work function greater than a work function of the first electrode layer,
wherein the first electrode layer comprises a metal nitride, and
wherein the first metal silicide layer is disposed between the first electrode layer and the capacitor insulating layer.

9. The semiconductor device according to claim 8, wherein:
the upper electrode further comprises a second electrode layer having a work function less than the work function of the first metal silicide layer, and
the first metal silicide layer is provided between the first and second electrode layers.

10. The semiconductor device according to claim 9, wherein:
the upper electrode further comprises a second metal silicide layer provided between the first and second electrode layers, and
a work function of the second metal silicide layer is different from the work function of the first metal silicide layer.

11. The semiconductor device according to claim 10, wherein:
the upper electrode further comprises a third metal silicide layer between the second metal silicide layer and the second electrode layer,
a work function of the third metal silicide layer is different from the work function of the second metal silicide layer, and
the work function of the third metal silicide layer is greater than the work function of the first electrode layer and the work function of the second electrode layer.

12. The semiconductor device according to claim 8, wherein:
the first electrode layer comprises TiN, and the first metal silicide layer comprises one of $CoSi_2$, NiSi, $Ni_2Si$, $Pd_2Si$, $ReSi_2$, $OsSi_{1.6}$, IrSi, $IrSi_3$, PtSi or $Pt_2Si$.

13. The semiconductor device according to claim 8, wherein:
the upper electrode further comprises a cover layer on the first electrode layer, and
the cover layer comprises SiGe.

14. The semiconductor device according to claim 8, wherein a thickness of the first metal silicide layer is smaller than a thickness of the first electrode layer.

15. A semiconductor device comprising;
a substrate; and
a capacitor structure electrically connected to the substrate,
wherein the capacitor structure comprises:
a lower electrode,
an upper electrode, and
a capacitor insulating layer between the lower electrode and the upper electrode,
wherein the upper electrode comprises a first metal silicide layer, and a first electrode layer on the first metal silicide layer,
wherein a work function of the first electrode layer is smaller than a work function of the first metal silicide layer, and
wherein the first metal silicide layer is disposed between the first electrode layer and the capacitor insulating layer.

16. The semiconductor device according to claim 15, wherein the first metal silicide layer comprises one of $TiSi_2$, TiSi, $Ti_5Si_3$, $VSi_2$, $CrSi_2$, $FeSi_2$, $CoSi_2$, NiSi, $Ni_2Si$, $Cu_3Si$, $YSi_{1.7}$, $ZrSi_2$, $NbSi_2$, $MoSi_2$, $Pd_2Si$, $HfSi_2$, $TaSi_2$, $WSi_2$, $ReSi_2$, $OsSi_{1.6}$, IrSi, $IrSi_3$, PtSi or $Pt_2Si$.

17. The semiconductor device according to claim 15, wherein:
the upper electrode further comprises a second electrode layer between the capacitor insulating layer and the first metal silicide layer, and
a work function of the second electrode layer is less than the work function of the first metal silicide layer.

18. The semiconductor device according to claim 17, wherein each of the first and second electrode layers comprises a metal nitride.

19. The semiconductor device according to claim 15, wherein:
the work function of the first electrode layer is equal to or less than 4.6 eV, and
the work function of the first metal silicide layer is more than 4.6 eV.

20. The semiconductor device according to claim 19, wherein:
the first electrode layer comprises TiN, and
the first metal silicide layer comprises one of $CoSi_2$, NiSi, $Ni_2Si$, $Pd_2Si$, $ReSi_2$, $OsSi_{1.6}$, IrSi, $IrSi_3$, PtSi or $Pt_2Si$.

* * * * *